United States Patent
Lu et al.

(10) Patent No.: US 6,903,000 B2
(45) Date of Patent: Jun. 7, 2005

(54) SYSTEM FOR IMPROVING THERMAL STABILITY OF COPPER DAMASCENE STRUCTURE

(75) Inventors: Jiong-Ping Lu, Richardson, TX (US);
Qi-Zhong Hong, Richardson, TX (US);
Tz-Cheng Chiu, Plano, TX (US);
Changming Jin, Plano, TX (US);
David Permana, Dallas, TX (US);
Ting Tsui, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/114,778

(22) Filed: Apr. 3, 2002

(65) Prior Publication Data

US 2003/0124828 A1 Jul. 3, 2003

Related U.S. Application Data

(60) Provisional application No. 60/344,465, filed on Dec. 28, 2001.

(51) Int. Cl.$^7$ .......................................... H01L 21/4763
(52) U.S. Cl. .................. 438/622; 438/637; 438/643
(58) Field of Search ........................ 438/622, 637, 438/642, 643, 687, 633; 257/704, 758, 750, 751

(56) References Cited

U.S. PATENT DOCUMENTS

| | | | | |
|---|---|---|---|---|
| 5,668,055 A | * | 9/1997 | Xu et al. ..................... | 438/637 |
| 5,814,557 A | * | 9/1998 | Venkatraman et al. ...... | 438/622 |
| 5,956,612 A | * | 9/1999 | Elliott et al. ................ | 438/637 |
| 6,404,053 B2 | * | 6/2002 | Givens ........................ | 257/751 |
| 6,426,293 B1 | * | 7/2002 | Wang et al. ................. | 438/687 |

FOREIGN PATENT DOCUMENTS

JP 05-243226 * 9/1993

* cited by examiner

Primary Examiner—Phat X. Cao
Assistant Examiner—Theresa T. Doan
(74) Attorney, Agent, or Firm—Peter K. McLarty; W. James Brady, III; Frederick J. Telecky, Jr.

(57) ABSTRACT

Disclosed is a system for fabricating a semiconductor device (100). An interconnect structure (110) is formed on the semiconductor device (100) and a cap (112) is deposited over the interconnect structure (110). The interconnect structure (110) is annealed with the overlying cap (112) in place. The cap (112) is then removed after the interconnect structure (110) is annealed.

8 Claims, 3 Drawing Sheets

SYSTEM FOR IMPROVING THERMAL STABILITY OF COPPER DAMASCENE STRUCTURE

This application claims priority from Provisional Application Ser. No.: 60/344,465, filed on Dec. 28, 2001.

FIELD OF THE INVENTION

The invention is related generally to the field of fabricating interconnect structures for integrated circuits and, more specifically, to improving the thermal stability of copper damascene interconnect structures.

BACKGROUND OF THE INVENTION

Since the invention of integrated circuits, the number of devices on a chip has grown at a near-exponential rate. The fabrication methods of the semiconductor industry have been modified and improved continuously for almost four decades. With each improved method, the capacity of a single semiconductor chip has increased from several thousand devices to hundreds of million devices. Future improvements will require integrated circuit devices such as transistors, capacitors, and connections between devices to become even smaller and more densely populated on the chip.

The increased packing density of the integrated circuit generates numerous challenges to the semiconductor manufacturing process. Every device must be smaller without damaging the operating characteristics of the integrated circuit devices. High packing density, low heat generation, and low power consumption, with good reliability and long operation life must be maintained without any functional device degradation. Increased packing density of integrated circuits is usually accompanied by smaller feature size.

As integrated circuits become denser, the widths of interconnect layers that connect transistors and other semiconductor devices of the integrated circuit are reduced. As the widths of interconnect layers and semiconductor devices decrease, their resistance increases. As a result, semiconductor manufacturers seek to create smaller and faster devices by using, for example, a copper interconnect instead of a traditional aluminum interconnect. Unfortunately, copper is very difficult to etch in a semiconductor process flow. Therefore, damascene processes have been proposed to form copper interconnects.

The damascene method involves forming a trench and/or an opening in a dielectric layer that lies beneath and on either side of the copper-containing structures. Once the trenches and/or openings are formed, a blanket layer of the copper-containing material is formed over the entire device. Electrochemical deposition (ECD) is typically the only practical method to form a blanket layer of copper. The thickness of such a layer must be at least as thick as the deepest trench and/or opening. After the trenches and/or the openings are filled with the copper-containing material, the copper-containing material over the trenches/openings is removed, e.g., by chemical-mechanical polishing (CMP), so as to leave the copper-containing material in the trenches and openings but not over the dielectric or over the uppermost portion of the trench/opening.

Copper deposited by ECD, however, has fine grains and will re-crystallize during subsequent processing steps. During anneal steps, deposited copper interconnects frequently form voids at via bottoms and other interfaces, which may ultimately cause device failure. One solution is to anneal the copper at low (below 200° C.) temperatures. A low temperature anneal, however, will not completely stabilize the deposited copper and also result in device failure. Finally, the copper may be annealed at high temperatures. Stresses within the copper interconnect structure may cause the interconnect to fail during the high temperature annealing process, which also causes via open failures.

Copper via and interconnect fabrication processes are growing in use. One example of a conventional interconnect fabrication process is depicted in FIGS. 1A–1E. In particular, FIG. 1A depicts a typical damascene interconnect process in which an interlevel dielectric (ILD) 12 is formed over a semiconductor body 10. The interlevel dielectric 12 is then patterned and etched to remove the dielectric material from the areas 14 where the interconnect lines are desired, as depicted in FIG. 1B. Referring now to FIG. 1C, a barrier layer 16 is then deposited over the structure including over the dielectric 12 and in the areas 14 where the dielectric has been removed. A copper seed layer 18 is then formed over the barrier layer 16. The copper layer 20 is then formed from the seed layer 18 using, for example, electrochemical deposition (ECD), which is also known as an electroplating process, as depicted in FIG. 1D. Chemical-mechanical polishing (CMP) is then used to remove the excess copper and planarize the copper 20 with the top of the interlevel dielectric layer 12, as depicted in FIG. 1E.

SUMMARY OF THE INVENTION

As should now be apparent, a method of forming copper interconnect structures that does not add excessive costs or procedures to the fabrication process is now needed, providing for fabrication of more reliable semiconductor devices while overcoming the aforementioned limitations of conventional methods.

The present invention provides a system for fabricating a semiconductor device. An interconnect structure is formed on the semiconductor device and a cap is deposited over the interconnect structure. The interconnect structure is annealed with the overlying cap in place. The cap is then removed after the interconnect structure is annealed.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION OF THE INVENTION

It should be understood that the principles and applications disclosed herein may be applied to a wide range of semiconductor device fabrication processes. For purposes of explanation and illustration, the present invention is hereafter described in reference to several specific embodiments of methods of semiconductor device fabrication. The present invention, however, is equally applicable in any number of fabrication processes that might benefit from the present invention.

Figure 1A:
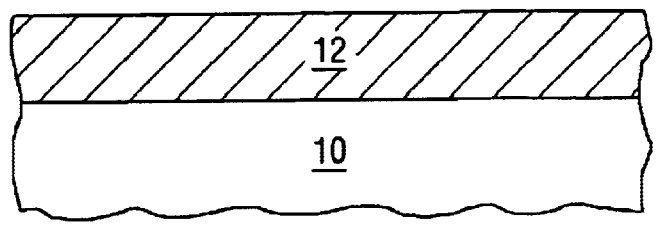
FIGS. 1A–1E depict a damascene interconnect fabrication process in accordance with the prior art.
Figure 1B:
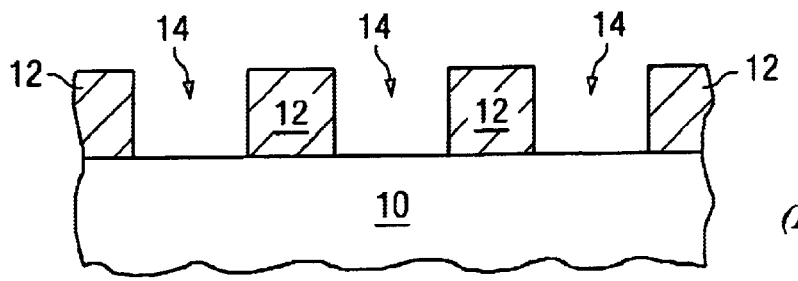
Figure 1C:
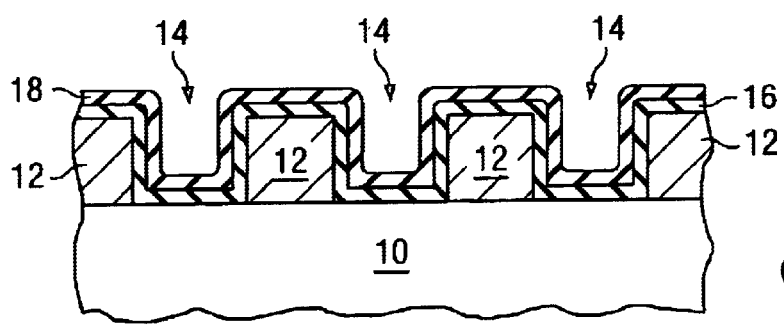
Figure 1D:
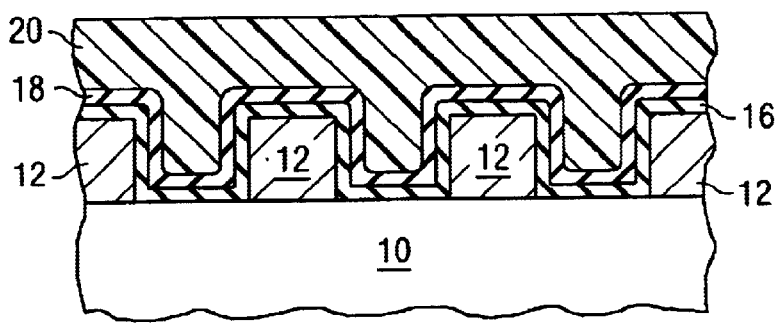
Figure 1E:
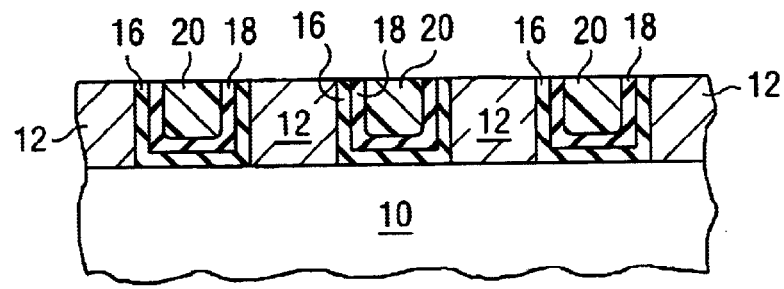
Figure 2A:
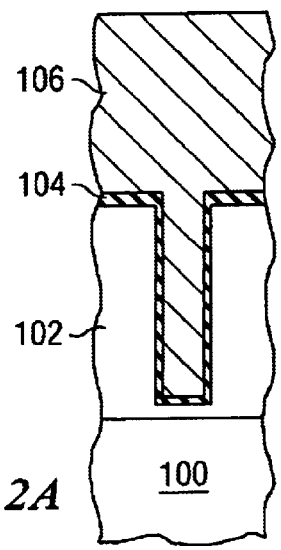
FIGS. 2A–2D depict an embodiment of an interconnect fabrication process in accordance with the present invention.

Turning now to the present invention as depicted in FIGS. 2A–2D, a copper interconnect structure may be formed, for example, generally according to the procedures depicted in and described with reference to FIGS. 1A–1D above. As depicted in FIG. 2A, the interlevel dielectric 102 is formed over the semiconductor body 100. The interlevel dielectric 102 is then patterned and etched to remove the dielectric material from the areas 118 (not shown) where interconnect lines are desired. The barrier layer 104 is then deposited over the structure including over the dielectric 102 and in the areas 118 (not shown) where the dielectric has been removed. The copper layer 106 is then formed from the seed layer 108 (not shown) using, for example, an ECD or electroplating process.

Figure 2B:
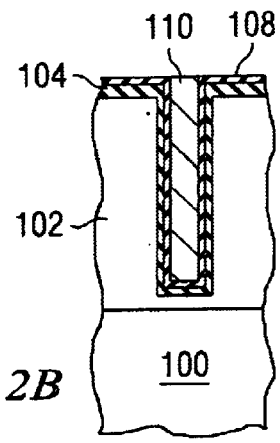

Turning now to FIG. 2B, chemical-mechanical polishing may be used to remove most of the excess copper from the copper layer 106. Chemical-mechanical polishing stops at the barrier layer 104 and may leave a thin layer of copper in seed layer 108 over the dielectric 102 and copper interconnect 110.

Figure 2C:
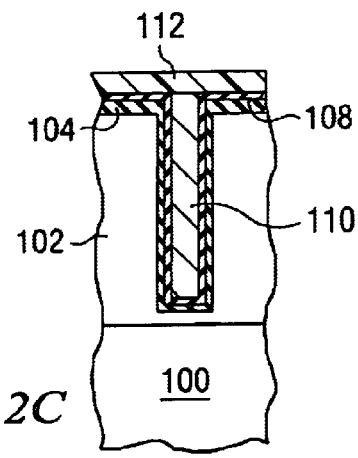

FIG. 2C depicts a low temperature deposition process that forms a cap 112 over the barrier layer 104 and any remaining seed layer 108. The cap 112 maintains compressive forces on the copper interconnect 110 during subsequent annealing or elevated temperature processes. The process that forms the cap 112 may occur at temperatures that are less than 200° C. The cap 112 may be formed from silicon nitride, silicon oxide, silicon dioxide or organic silicon glass (OSG), for example, by conventional chemical vapor deposition (CVD) or spin-on tools, and may be easily implemented in manufacturing processes. Thickness of the cap 112 may be in the range of about 10 nm to about 200 nm, although the stress reduction in the copper interconnect 110 is relatively independent of the thickness of the cap 112, as will be described with reference to FIG. 3.

Figure 2D:
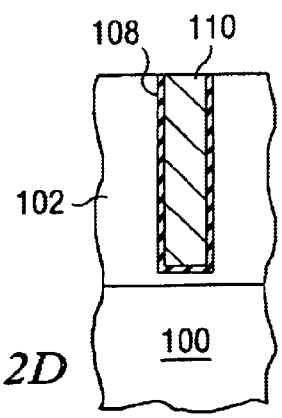

In FIG. 2D, an annealing process is performed to stabilize the copper interconnect 110. The annealing process may be performed at or near the interlevel dielectric deposition temperature. In a first embodiment the annealing process is performed at a temperature of above 200° C. In a second embodiment the annealing process is performed at a temperature of 780° C. Compressive forces from the initial chemical-mechanical polishing and the cap 112 suppress the effects of residual tensile stress, which result from the annealing process, in the copper interconnect 110. As a result, the copper interconnect 110 is less likely to detach from the dielectric 102, thereby creating open failures, during the annealing process and subsequent high temperature processes. Production yield consequently increases because open failures are reduced. After the annealing process, the cap 112 and the barrier layer 108 may be removed in a single chemical-mechanical polishing process. Deposition of the cap 112, therefore, adds minimal fabrication steps that may be easily implemented into many semiconductor manufacturing processes.

Figure 3:
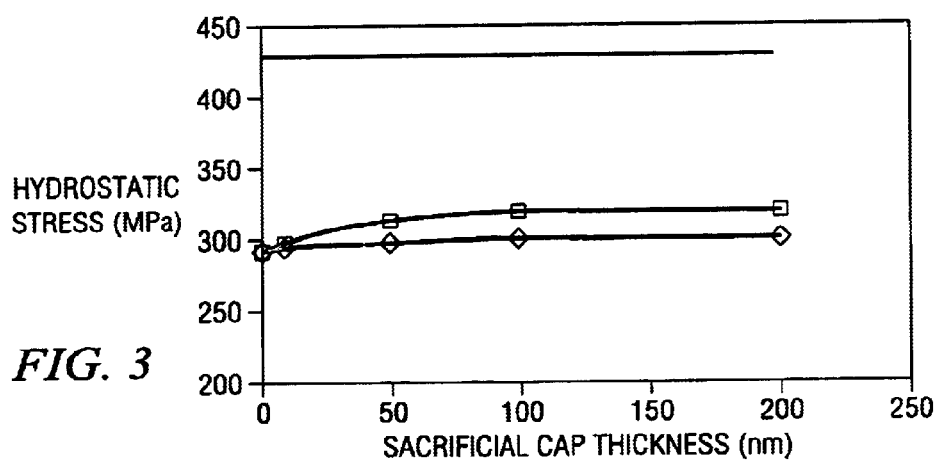
FIG. 3 depicts a chart of stress reduction results in accordance with the present invention.

As depicted in FIG. 3, the internal stress reduction benefit of cap 112 is relatively independent of the thickness of cap 112. For example, after annealing, the hydrostatic stress in the copper interconnect 110 remains between about 300 Mpa and 325 Mpa if the thickness of cap 112 is between about 50 nm and 200 nm. For comparison, stress in an uncapped copper layer 106 after annealing is approximately 425 Mpa. Therefore, less material may be used to form the cap 112 while still gaining the stress reducing benefits of the cap 112. Process costs and time are consequently saved.

Figure 4A:
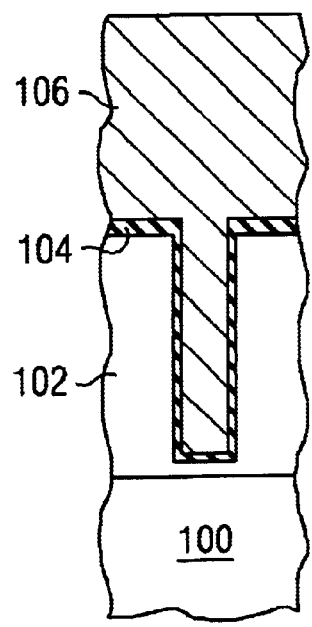
FIGS. 4A–4D depict another embodiment of an interconnect fabrication process in accordance with the present invention.

Another embodiment of the present invention is depicted in FIGS. 4A–4D. A copper interconnect structure may be formed, for example, generally according to the procedures depicted in and described with reference to FIGS. 1A–1D above. As depicted in FIG. 4A, the interlevel dielectric 102 is formed over the semiconductor body 100. The interlevel dielectric 102 is then patterned and etched to remove dielectric material from the areas 118 (not shown) where interconnect lines are desired. The barrier layer 104 is then deposited over the structure including over the dielectric 102 and in the areas 118 (not shown) where the dielectric has been removed. The copper layer 106 is then formed from the seed layer 108 (not shown) using, for example, an electrochemical deposition/electroplating process.

Figure 4B:
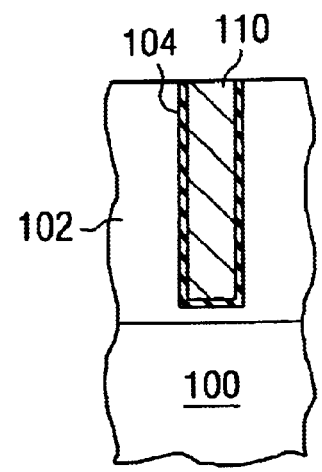

As depicted in FIG. 4B, chemical-mechanical polishing may be used to remove the excess copper from the copper layer 106 and also remove the barrier layer 104.

Figure 4C:
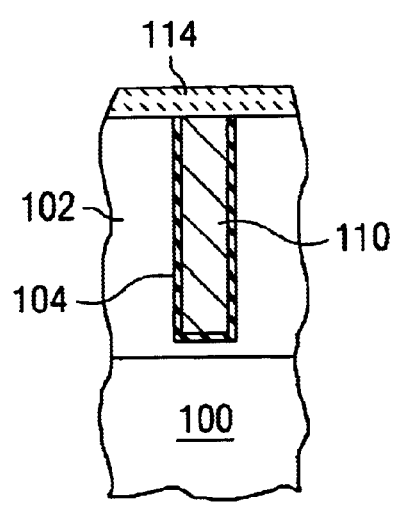

FIG. 4C depicts a low temperature deposition process that forms a cap 114 over the copper interconnect 110 and the dielectric 102. The cap 112 maintains compressive forces on the copper interconnect 110 during subsequent annealing or elevated temperature processes. In this particular embodiment, the cap 114 may also serve as an etch stop. The process that forms the cap 114 may occur at temperatures that are less than 200° C. The cap 114 may be formed from silicon nitride, silicon oxide, silicon dioxide or OSG, for example, by conventional chemical vapor deposition (CVD) or spin-on tools, and may be easily implemented in manufacturing processes. Thickness of the cap 114 may be in the range of about 10 nm to about 200 nm, although the stress reduction in the copper interconnect 110 is relatively independent of the thickness of the cap 114, as described with reference to FIG. 3.

Figure 4D:
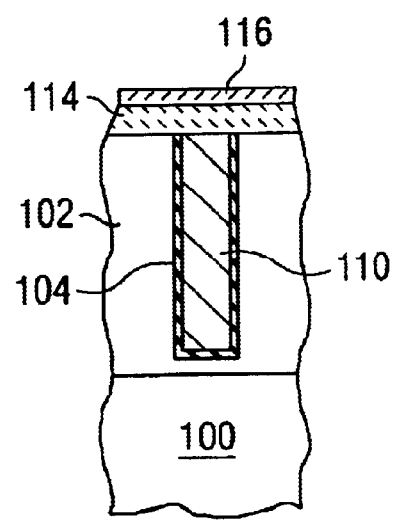

In FIG. 4D, an annealing process is performed to stabilize the copper interconnect 110. The annealing process may be performed at or near the interlevel dielectric deposition temperature. Compressive forces from the initial chemical-mechanical polishing and the cap 114 suppress the effects of residual tensile stress, which result from the annealing process, in the copper interconnect 110. As a result, the copper interconnect 110 is less likely to detach from the dielectric 102, thereby creating open failures, during the annealing process and subsequent high temperature processes. Production yield consequently increases because open failures are reduced. After the annealing process, the cap 114 is used as an etch stop layer and an interlevel dielectric 116 may be deposited on top of the cap 114. In this particular embodiment, deposition of the cap 114 saves the time and cost of an additional chemical-mechanical polishing by acting as an etch stop.

Although this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the spirit and scope of the invention. It is therefore intended that the appended claims encompass any such modifications or embodiments.

What is claimed is:

1. A method of fabricating a semiconductor device, comprising the steps of:

forming a dielectric layer over a semiconductor body;

forming a trench in the dielectric layer;

forming a copper layer in said trench;

depositing a cap over the copper layer at a temperature about or less than 200° C. wherein said cap maintains a compressive force on said cooper layer;

annealing the copper layer; and removing the cap.

2. The method of claim 1 wherein the copper layer is formed by electrochemical deposition.

3. The method of claim 1 wherein the cap is deposited by chemical vapor deposition.

4. The method of claim 1 wherein the cap is deposited by a spin-on tool.

5. The method of claim 1 wherein the step of annealing the copper layer is annealing at a temperature above 200° C.

6. The method of claim 1 wherein the step of annealing the copper layer is annealing at 780° C.

7. The method of claim 1 wherein the step of removing the cap is by chemical-mechanical polishing.

8. The method of claim 1, wherein the step of depositing the cap comprises depositing a cap from a material chosen from the group of silicon nitride, silicon oxide, silicon dioxide or organic silicon glass.

* * * * *